(12) United States Patent
Hosono

(10) Patent No.: US 7,385,431 B2
(45) Date of Patent: Jun. 10, 2008

(54) INPUT CIRCUIT AND AN ELECTRONIC CONTROL UNIT PROVIDED WITH SUCH AN INPUT CIRCUIT

(75) Inventor: Tsuyoshi Hosono, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 373 days.

(21) Appl. No.: 11/234,799

(22) Filed: Sep. 23, 2005

(65) Prior Publication Data

US 2006/0082382 A1     Apr. 20, 2006

(30) Foreign Application Priority Data

Sep. 24, 2004   (JP)   ............... 2004-277162

(51) Int. Cl.
    *H03K 17/00* (2006.01)
(52) U.S. Cl. ............... 327/407; 315/77; 340/468
(58) Field of Classification Search ............... 327/407, 327/409
    See application file for complete search history.

(56) References Cited

U.S. PATENT DOCUMENTS

| | | | |
|---|---|---|---|
| 5,541,550 A * | 7/1996 | Bohme | 327/520 |
| 7,078,861 B2 * | 7/2006 | Masaoka | 315/82 |
| 2002/0056445 A1 * | 5/2002 | Inagaki et al. | 123/609 |
| 2004/0066143 A1 * | 4/2004 | Ito et al. | 315/77 |
| 2004/0207328 A1 * | 10/2004 | Ito et al. | 315/77 |
| 2005/0110415 A1 * | 5/2005 | Masaoka | 315/77 |

FOREIGN PATENT DOCUMENTS

| | | |
|---|---|---|
| JP | 5-18126 | 3/1993 |
| JP | 08106834 | 4/1996 |
| JP | 2002-185293 | 6/2002 |

* cited by examiner

*Primary Examiner*—Quan Tra
*Assistant Examiner*—Ryan C Jager
(74) *Attorney, Agent, or Firm*—Gerald E. Hespos; Anthony J. Casella

(57) ABSTRACT

An input circuit commonly uses input ports of a microcomputer for a plurality of contact input terminals such as switches provided on the way to the ground. Transistors (Q1) to (Q8) whose bases are connected with contact input terminals (IN1) to (IN8) are provided. Groups of transistors, such as odd-numbered transistors and even-numbered transistors, are made selectable or non-selectable together by a selection output from an I/O port (P01) or (P02) of a microcomputer (12), and collector currents of a plurality of transistors (Q1, Q2; Q3, Q4; Q5, Q6; Q7, Q8) which are not simultaneously selected are converted into voltages using common resistors (R1) to (R4). These voltages then are fed to I/O ports (P1) to (P4). Accordingly, even upon a rise of a contact input from a ground potential due to the ON resistance of switches (SW1) to (SW8), the states of the contacts can be judged precisely.

6 Claims, 4 Drawing Sheets

INPUT CIRCUIT AND AN ELECTRONIC CONTROL UNIT PROVIDED WITH SUCH AN INPUT CIRCUIT

BACKGROUND OF THE INVENTION

1. Field of the Invention

The invention relates to an input circuit to commonly use input ports of a microcomputer, such as an automotive electronic control unit, that has multiple contact inputs, such as switches, on the way to a ground. The invention also relates to an electronic control unit with such an input circuit, and particularly to those suitably used to judge the states of contacts between large power loads and the ground.

2. Description of the Related Art

A microcomputer, such as an automotive electronic control unit, has a multitude of contact inputs for various controls. The number of I/O ports of the microcomputer are predetermined. Microcomputers with fewer I/O ports generally are smaller and less expensive than microcomputers of comparable performance with more I/O ports. Accordingly, it is desirable to use a microcomputer with fewer I/O ports if this microcomputer can satisfy a desired performance. However, the number of I/O ports seldom coincides with the number of the contact input terminals. An input circuit is provided to commonly use one I/O port by a plurality of contact input terminals if there is a shortage of I/O ports.

Japanese Unexamined Patent Publication No. 2002-185293 and FIG. 4 disclose a block diagram of an electronic control unit (ECU). With reference to FIG. 4, a typical prior art input circuit 1 is at an input side of a microcomputer 2. In this input circuit 1, contact inputs given from corresponding contact input terminals in1 to in8 by eight switches sw1 to sw8 can be judged using six I/O ports p01, p02, p1 to p4 of the microcomputer 2.

One end of each switch sw1 to sw8 is grounded, whereas the other end thereof is connected with the corresponding contact input terminal in1 to in8. The respective contact terminals in1 to in8 are connected with low-side terminals of loads (a lamp load 1 is connected with the contact input terminal in1 in FIG. 4), and high-side terminals of the loads are connected with high-side terminals of batteries b. Accordingly, the respective contact input terminals in1 to in8 take a ground potential when the switches sw1 to sw8 are turned on while being open or having a specified high level when the switches sw1 to sw8 are turned off.

In order to read the potentials at the respective contact input terminals in1 to in 8, cathodes of diodes d11 to d81 are connected with the corresponding contact input terminals in1 to in 8, and anodes thereof are connected with anodes of corresponding diodes d12 to d82 arranged in inverse series via resistors r11 to r81. Cathodes of the diodes d12 to d82 are connected in pairs which become common inputs, and are connected with the respective I/O ports p1 to p4 as input ports of the microcomputer 2 via resistors r1 to r4 and resistors r5 to r8. On the other hand, ends of pull-up resistors r12 to r82 at one side are connected with nodes t1 to t8 between the resistors r11 to r81 and the anodes of the diodes d12 to d82. The other ends of the pull-up resistors r12, r32, r52 and r72 are commonly connected and those of the pull-up resistors r22, r42, r62 and r82 are commonly connected, and these ends are further connected with a high-level power supply Vcc via control transistors q1, q2. Selection outputs are given to bases of the control transistors q1, q2 from the I/O ports p01, p02 as output ports of the microcomputer 2. The control transistors q1,q2 are of the p type. The control transistors q1, q2 are turned off not to be selected when a high-level voltage VDD (5 V) is outputted from the I/O ports p01, p02, whereas they are turned on to be selected when a low-level voltage (ground potential) is outputted therefrom.

Accordingly, if the control transistor q1 is selected and the control transistor q2 is not selected when the I/O port p01 is held low and the I/O port p02 is held high, potentials at the nodes t1, t3, t5, t7 corresponding to the odd-numbered contact input terminals in1, in3, in5, in7 are pulled up to the high-level potential Vcc by the pull-up resistors r12, r32, r52, r72. At this time, if the corresponding switches sw1, sw3, sw5, sw7 are off, a voltage vref lower than the potential Vcc by a predetermined voltage such as a voltage between an emitter and a collector of the transistor q1 or forward voltages of the diodes d12, d32, d52, d72 is fed to the I/O ports p1 to p4 of the microcomputer 2. On the other hand, if the switches sw1, sw3, sw5, sw7 are on, the respective nodes t1, t3, t5, t7 take the ground potential, which is fed to the respective I/O ports p1 to p4.

The nodes t2, t4, t6, t8 corresponding to the even-numbered contact input terminals in2, in4, in6, in8 of the non-selected side take the ground potential if the corresponding switches sw2, sw4, sw6, sw8 are on. However, since the diodes d22, d42, d62, d82 are shut off, there is no influence on the potential fed to the I/O ports p1 to p4. If the switches sw2, sw4, sw6, sw8 are off, the corresponding contact input terminals in2, in4, in6, in8 are open since the transistor q2 is off, wherefore there is no influence on the potential fed to the I/O ports p1 to p4.

In this way, when the I/O port p01 is held low and the I/O port p02 is held high, the states of the switches sw1, sw3, sw5, sw7 connected with the odd-numbered contact input terminals in1, in3, in5, in7 can be judged. When the I/O port p02 is held low and the I/O port p01 is held high, the states of the switches sw2, sw4, sw6, sw8 connected with the even-numbered contact input terminals in2, in4, in6, in8 can be judged. As compared to a case where the I/O ports are caused to correspond to the respective contact input terminals in1 to in 8, the contact inputs can be judged using a smaller number of ports.

There are many large power loads in an automotive electronic control unit, including the lamp load 1, a wiper motor and a heating coil, and their load currents may be drawn directly by the switches sw1 to sw8. A contact resistance when the switches sw1 to sw8 are on is, for example, 0.2 ($\Omega$). Accordingly, if a load current of, e.g. 10 (A) flows, the potentials at the respective contact input terminals in1 to in8 rise to 2(V) from the ground potential when the switches sw1 to sw8 are on with the input circuit 1 constructed as above.

On the other hand, a low-level voltage VIL recognizable by the I/O ports p1 to p4 of a general inexpensive microcomputer 2 is about VDD×0.2 (V). Accordingly, if VDD=5 (V), VIL=1 (V). If the potential rises from the ground potential by as much as 2(V), the microcomputer 2 erroneously recognizes the switches sw1 to sw8 to be off even though they are on.

To solve such a problem, the electronic control unit must not depend on the low-level recognizable voltage and must use a microcomputer having a high low-level recognizable voltage VIL (=VDD×0.5(V)) or a microcomputer having an analog-to-digital converting function, as disclosed in Japanese Unexamined Patent Publication No. 2002-185293. This requires an expensive microcomputer that is not generally used.

An object of the present invention is to provide an input circuit capable of precisely judging the states of contacts even upon a rise of a contact input from a ground potential due to the on-resistance of a switch, and an electronic control unit provided with such an input circuit.

SUMMARY OF THE INVENTION

The invention relates to an input circuit for commonly using input ports of a microcomputer for contact inputs of a plurality of channels by selection outputs from output ports of the microcomputer. The input circuit includes first transistors for the respective contact inputs. The first transistors have bases connected with the contact inputs and emitters to which the selection output is given. The input circuit also has resistors with one terminal connected with collectors of the first transistors of the commonly used channels and the other terminal grounded. A voltage at the one terminal of each resistor is fed to the corresponding input port of the microcomputer.

The above-described input circuit is provided to commonly use the input ports of the microcomputer for a plurality of contact inputs, such as switches, provided on the way to the ground. The first transistors are provided for the contact input terminals and the input ports of the microcomputer are commonly used by selecting the first transistors by the selection output from the output port. Specifically, the bases of the first transistors are connected individually with the corresponding contact input terminals. Thus, inputs to the bases are voltages corresponding to a ground potential or a connected load. Further, the selection output from the output port of the microcomputer is given to the emitters of all the first transistors having a one-on-one correspondence with the respective input ports. The collectors of the first transistors are commonly connected between common channels, and therefore are connected with the one terminal of the corresponding resistor having the other terminal grounded, and a voltage Vref at this terminal is given to the corresponding input port of the microcomputer. If the voltage Vref is equal to or above a predetermined low-level recognition voltage VIL, the contact input terminals corresponding to the selected first transistors can be judged to take the ground potential (ON). On the other hand, if the voltage Vref is below the recognition voltage VIL, the contact input terminals can be judged to be open (OFF). Since no collector current flows from the non-selected first transistors even if the common resistor is used, only the states of the contact inputs corresponding to the selected first transistors can be precisely judged.

Accordingly, even upon a rise of the contact input from the ground potential due to the on-resistance of the switch, it is sufficient for the microcomputer to distinguish the terminal voltage Vref inputted when the first transistors are turned on from the ground potential inputted when the first transistors are turned off, and the states of the contacts can be precisely judged despite the rise of the contact inputs from the ground potential even if an inexpensive microcomputer having a low recognition voltage VIL is used by setting the terminal voltage Vref to be sufficiently larger than the recognition voltage VIL.

Diodes for preventing the inflow of an undesired current from a high potential or a low potential when the contact input is off may be provided at the bases of the first transistors. Similarly, diodes for preventing the inflow of a current from a common resistor may be provided at the collectors of the first transistors. Further, input resistors may be provided between the resistors and the input ports of the microcomputer.

According to a preferred embodiment of the invention, the input circuit further comprises second transistors having bases connected with the output ports of the microcomputer, emitters connected with a power supply, and collectors connected with the collectors of the first transistors.

With this construction, when the selection output is given from the output port of the microcomputer, no sufficient on-voltage is ensured between the bases and the emitters of the first transistors and there is a possibility of causing the first transistors to erroneously operate upon a rise of the contact inputs from the ground potential in the case that a power supply voltage to the microcomputer is low. Further, in the case that a multitude of first transistors are connected with one output port, a current flowing into said resistor becomes smaller, whereby the terminal voltage Vref does not become sufficiently larger than a threshold voltage Vth. Thus, there is a possibility of an error judgment in the microcomputer. Accordingly, the second transistors are provided to be on/off controlled by the selection output, and power is supplied to the first transistors from a power supply different from the one for the microcomputer.

Accordingly, in the case that the power supply voltage to the microcomputer is low and in the case that a multitude of first transistors are connected with one output port of the microcomputer, the states of the selected contact inputs can be judged precisely without causing an erroneous operation.

Cathodes of diodes preferably are connected with the corresponding contact input terminals, while anodes thereof are connected with bases of the corresponding first transistors via second resistors.

Further preferably, a resistor is provided between the base and the emitter of each first transistor.

Most preferably, a resistance value $R_{BE}$ of the resistors provided between the base and the emitter of each first transistor and a resistance value R of the second resistors are set such that $$(VDD-V1)R_{BE}/(R_{BE}+R) \geq V_{BE}$$

assuming that V1, VDD and $V_{BE}$ denote a rise of the potential at the contact input terminals, a high-level output voltage of I/O ports of the microcomputer, and an on-voltage of the first transistors.

According to the invention, there is further provided an electronic control unit comprising the above input circuit at an input side of a microcomputer.

Particularly in an automotive electronic control unit, a large power load such as a lamp, a wiper motor or a heating coil is directly connected with the contact input terminal provided on the way to the ground, and a rise of several V from the ground potential is caused by the on-resistance when a load current flows. By using the inventive electronic control unit, the states of the contacts can be precisely judged despite such a rise. Therefore, the present invention is particularly suitably applicable to such an electronic control unit.

The above input circuit is provided to commonly use the input ports of the microcomputer for a plurality of contact inputs such as switches provided on the way to the grounds as described above. The first transistors are provided for the respective contact input terminals, and the microcomputer selects or does not select the first transistors together for the corresponding input ports. The microcomputer also converts the collector currents of the first transistors of the common channels which are not simultaneously selected into voltages using the common resistor, and feeds the converted voltages to the input ports of the microcomputer.

Therefore, even upon a rise of the contact input from the ground potential due to the on-resistance of the switch, it is sufficient for the microcomputer to distinguish the terminal voltage Vref inputted when the first transistor is turned on from the ground potential inputted when the first transistor is turned off, and the states of the contacts can be precisely judged despite such a rise even if an inexpensive microcomputer whose recognition voltage VIL is low is used by setting the terminal voltage Vref to be sufficiently larger than the recognition voltage VIL.

In the above electronic control unit, particularly in an automotive electronic control unit, the above input circuit is provided at the input side of the microcomputer in consideration of a rise of several V from the ground potential due to the on-resistance when a large power load such as a lamp, a wiper motor or a heating coil is directly connected with the contact input terminal provided on the way to the ground and a load current flows.

Therefore, the states of the contacts can be precisely judged and the present invention is particularly suitably applicable.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 1:
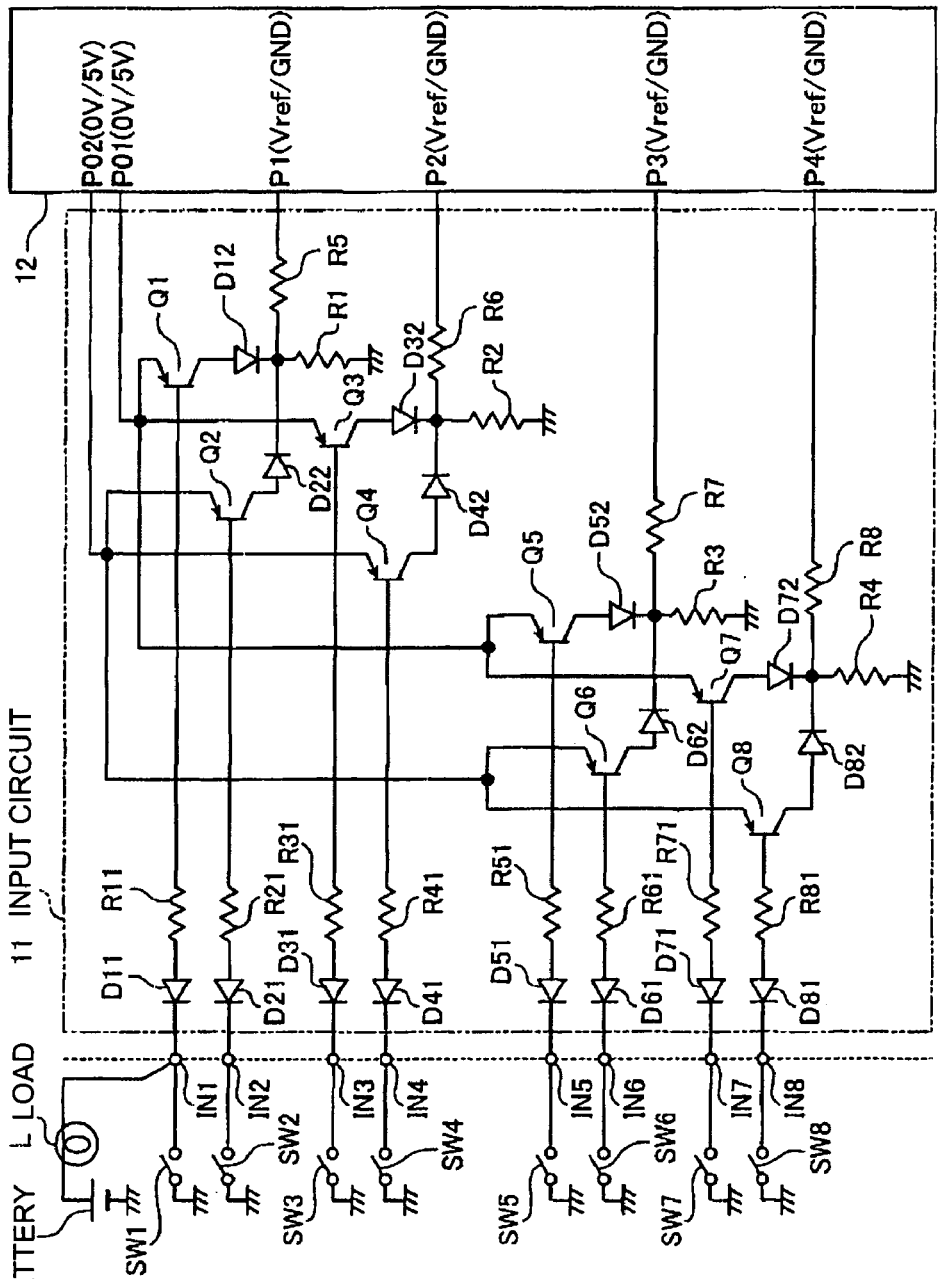
FIG. 1 is a block diagram of an electronic control unit provided with an input circuit according to one embodiment of the invention at an input side of a microcomputer.
Figure 4:
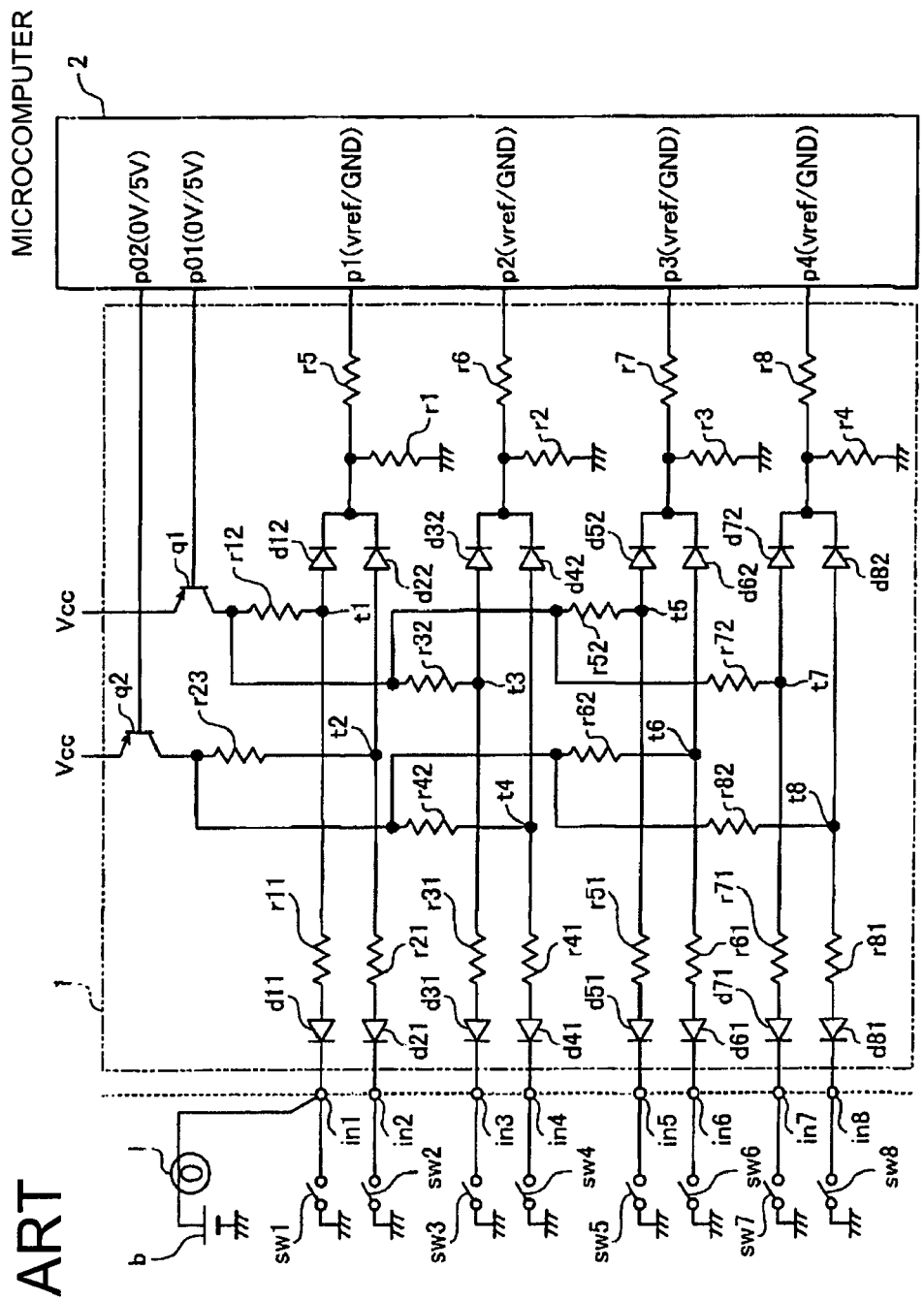
FIG. 4 is a block diagram of an electronic control unit provided with an prior art input circuit at an input side of a microcomputer.

FIG. 1 is a block diagram of an electronic control unit (ECU) provided with an input circuit 11 according to one preferred embodiment of the present invention at an input side of a microcomputer 12. Similar to the input circuit 1 shown in FIG. 4, this input circuit 11 can also judge contact inputs given from contract input terminals IN1 to IN8 by eight switches SW1 to SW8 using six I/O ports P01, P02, P1 to P4 of the microcomputer 12.

One end of each of switches SW1 to SW8 is or is to be grounded, and the other end thereof is connected with a corresponding one of contact input terminals IN1 to IN8. The respective contact input terminals IN1 to IN8 are connected with low-side terminals of loads (preferably lamp load L is connected with the contact input terminal IN1 in FIG. 1), and high-side terminals of the loads are connected with high-side terminals of batteries B. Accordingly, the respective contact input terminals IN1 to IN8 take a ground potential when the switches SW1 to SW8 are turned on while being open or held at a specified (predetermined or predeterminable) high level when they are turned off. The above construction is similar to that of the input circuit 1 shown in FIG. 4.

What should be noted in the present embodiment of the invention is that, in order to read the potentials at the respective contact input terminals IN1 to IN8, cathodes of diodes D11 to D51 are connected with the corresponding contact input terminals IN1 to IN8 while anodes thereof are connected with bases of the corresponding transistors Q1 to Q8 via resistors R11 to R81. Collectors of the transistors Q1 to Q8 are connected by twos to give common inputs, and are connected with the corresponding I/O ports P1 to P4 as input ports of the microcomputer 12 via resistors R1 to R4 and resistors R5 to R8 for the input to the microcomputer 12. On the other hand, emitters of the odd-numbered transistors Q1, Q3, Q5, Q7 and emitters of the even-numbered transistors Q2, Q4, Q6, Q8, the odd-numbered transistors and the even-numbered transistors being not simultaneously selectable, are commonly connected and further connected with the I/O ports P01, P02 as output ports of the microcomputer 12. The transistors Q1 to Q8 are of the p type. When a high level voltage VDD (5V) is outputted from the I/O ports P01, P02, the transistors Q1 to Q8 enter a selectable state where they can be turned on by a base potential. When a low-level voltage (ground potential) is outputted, the transistors Q1 to Q8 are turned off to enter a non-selectable state independently of the base potential.

Accordingly, if the odd-numbered transistors Q1, Q3, Q5, Q7 become selectable and the even-numbered transistors Q2, Q4, Q6, Q8 becomes non-selectable when the I/O port P0 is held high and the I/O port P02 is held low, the transistors Q1, Q3, Q5, Q7 are turned off if the switches SW1, SW3, SW5, SW7 corresponding to the odd-numbered transistors Q1, Q3, Q5, Q7 are off. Consequently, the respective I/O ports P1 to P4 of the microcomputer 12 take a ground potential since currents (currents to be converted into voltages) flowing into the resistors R1 to R4 are substantially 0. Thus, even if the microcomputer 12 is an expensive and general microcomputer in which a low-level voltage VIL recognizable by the I/O ports P1 to P4 is about VDD×0.2 (V), the low-level voltage VIL can be precisely recognized.

On the other hand, if the switches SW1, SW3, SW5, SW7 are on, the transistors Q1, Q3, Q5, Q7 are turned on and their collector currents flow into the resistors R1 to R4, whereby the respective I/O ports P1 to P4 of the microcomputer 12 take a terminal voltage Vref lower than the potential of the high level voltage VDD (5V) of the I/O port P01 by a predetermined or predeterminable voltage such as a voltage $V_{CE}$ between the emitters and the collectors of the transistors Q1, Q3, Q5, Q7 or forward voltages $V_F$ of diodes D12, D32, D52, D72. For example, if VDD=5 (V), $V_{CE}$=0.3 (V), $V_F$=0.7 (V), Vref=VDD−$V_{CE}$−$V_F$=4 (V).

Here, the states of the switches SW2, SW4, SW6, SW8 corresponding to the even-numbered contact input terminals IN2, IN4, IN6, IN8 in the non-selectable state gives no influence on the potentials given to the I/O ports P1 to P4 since the corresponding transistors Q2, Q4, Q6, Q8 are off as described above.

In this way, when the I/O port P01 is held high and the I/O port P02 is held low, the states of the switches SW1, SW3, SW5, SW7 connected with the odd-numbered contact input terminals IN1, IN3, IN5, IN7 can be judged. When the I/O port P02 is held high and the I/O port P01 is held low, the states of the switches SW2, SW4, SW6, SW8 connected with the even-numbered contact input terminals IN2, IN4, IN6, IN8 can be judged. Thus, the contact inputs can be judged using a smaller number of ports as compared to a case where the I/O ports are let to correspond to the respective contact input terminals IN1 to IN8. Further, in the microcomputer 12, the input voltages to the I/O ports P1 to P4 are the ground potential when the transistors Q1 to Q8 are off. Therefore, even if an inexpensive and general microcomputer in which the low-level recognition voltage VIL is about VDD×0.2 (V) is used, the states of the switches SW1 to SW8 can be precisely judged by setting the terminal voltage Vref to be sufficiently larger than the recognition voltage VIL.

Although not shown in FIG. 1, a resistor is provided between the base and the emitter of each transistor Q1 to Q8. If a resistance value of these resistors is $R_{BE}$ and a resistance value of the resistors R11 to R81 is R, these values are selected or set as follows. Specifically, it is assumed that V1, VDD and $V_{BE}$ denote a rise of the potential at the contact input terminals IN1 to IN8 from the ground potential caused by a load current when the switches SW1 to SW8 are turned on, a high-level output voltage of the I/O ports P01, P02, and an on-voltage of the transistors Q1 to Q8. By satisfying $$(VDD-V1)R_{BE}/(R_{BE}+R) \geq V_{BE},$$

the transistors Q1 to Q8 are securely turned on if the switches SW1 to SW8 are on even if the above rise occurs. Therefore, the states of the switches SW1 to SW8 can be precisely judged.

Accordingly, to enable the states of contact to be precisely judged even upon a rise of potentials at contact input terminals from a substantially ground potential in an input circuit provided to commonly use input ports of a microcomputer for a plurality of contact input terminals such as switches provided on the way to the ground, transistors Q1 to Q8 whose bases are connected with contact input terminals IN1 to IN8 are provided. Groups of a plurality of transistors such as odd-numbered transistors and even-numbered transistors are made selectable or non-selectable together by a selection output from an I/O port P01 or P02 of a microcomputer 12, and collector currents of a plurality of transistors Q1, Q2; Q3, Q4; Q5, Q6; Q7, Q8 which are not simultaneously selected are converted into voltages using common resistors R1 to R4, which voltages are then fed to I/O ports P1 to P4. Accordingly, even upon a rise of a contact input from a ground potential due to the ON resistance of switches SW1 to SW8, the states of the contacts can be precisely judged.

Figure 2:
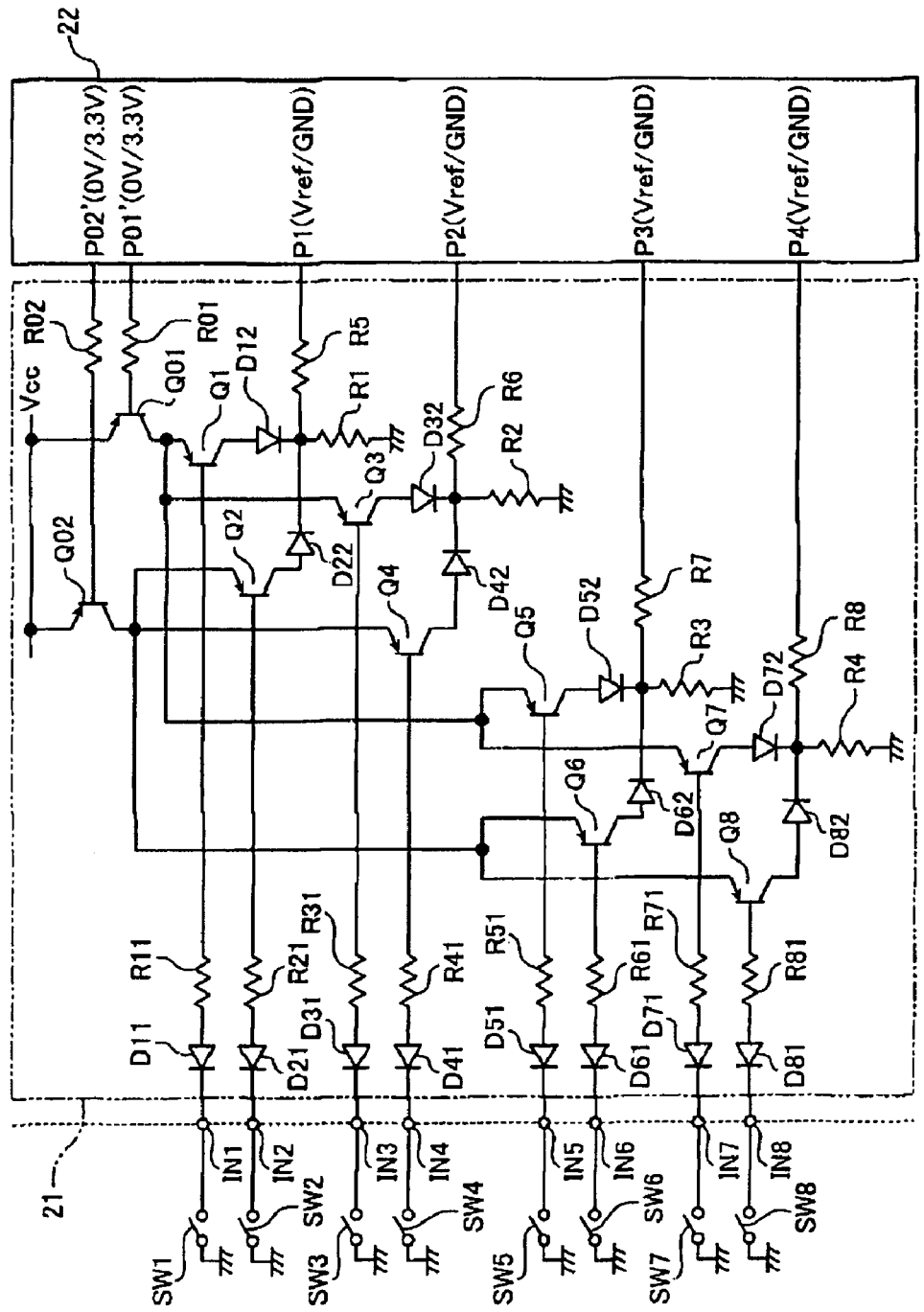
FIG. 2 is a block diagram of an electronic control unit provided with an input circuit according to another embodiment of the invention at an input side of a microcomputer.

FIG. 2 is a block diagram of an electronic control unit (ECU) provided with an input circuit 21 according to another embodiment of the invention at an input side of a microcomputer 22. This input circuit 21 is analogous or similar to the aforementioned input circuit 11, and corresponding or similar elements are not described by being identified by the same reference numerals. What should be noted is that a power supply voltage of the microcomputer 22 is low in this input circuit 21. Thus, the respective transistors Q1, Q3, Q5, Q7 and Q2, Q4, Q6, Q8 are respectively driven by transistors Q01, Q02. One example is described below assuming that VDD=3.3 (V).

The emitters of the respective transistors Q1, Q3, Q5, Q7; Q2, Q4, Q6, Q8 are connected with collectors of the transistors Q01, Q02 without being directly connected with I/O ports P01', P02' of the microcomputer 22 for switching the states of these transistors between selectable and non-selectable states, and bases of the transistor Q01,Q02 are controlled by the I/O ports P01', P02' of the microcomputer 22 via resistors R01, R02. Emitters of the transistors Q01, Q02 are connected with a power supply line of a high level voltage Vcc of e.g. 5 (V) or 12 (V).

The transistors Q01, Q02 preferably are of the p type. Accordingly, when the high-level voltage VDD (e.g. 3.3 V) is outputted from the I/O ports P01', P02', the transistors Q01, Q02 are turned off to make the selection of the respective transistors Q1, Q3, Q5, Q7; Q2, Q4, Q6, Q8 impossible. When a low-level voltage (e.g. ground potential) is outputted, the transistors Q01, Q02 are turned on to make the selection of the respective transistors Q1, Q3, Q5, Q7; Q2, Q4, Q6, Q8 possible.

By constructing as above, in the case of a rise of, e.g. 2 (V) from the ground potential at the contact input terminals IN1 to IN8, a voltage applied to the bases of the respective transistors Q1 to Q8 becomes 2.7 (V) if the forward voltages $V_F$ of the diodes D11 to D81 are 0.7 (V). If the power supply voltage VDD to be applied to the emitters of the transistors Q1 to Q8 is e.g. 3.3 (V), only e.g. 0.6 (V) can be given as the voltage $V_{BE}$ between the base and the emitter of each transistor in the case of the input circuit 11, thereby presenting a possibility that the transistors Q1 to Q8 are not turned on. However, an erroneous operation does not occur in the input circuit 21 by letting the transistors Q01, Q02 give the high-level voltage Vcc. As a result, the states of the selected contact input terminals IN1 to IN8 can be judged precisely.

This technology is applicable not only in the case that the power supply voltage VDD to the microcomputer 22 is low as described above, but also in the case that a multitude of transistors are connected in parallel with the I/O ports P01, P02 for control. This case is described in more detail with reference to FIG. 3.

Figure 3:
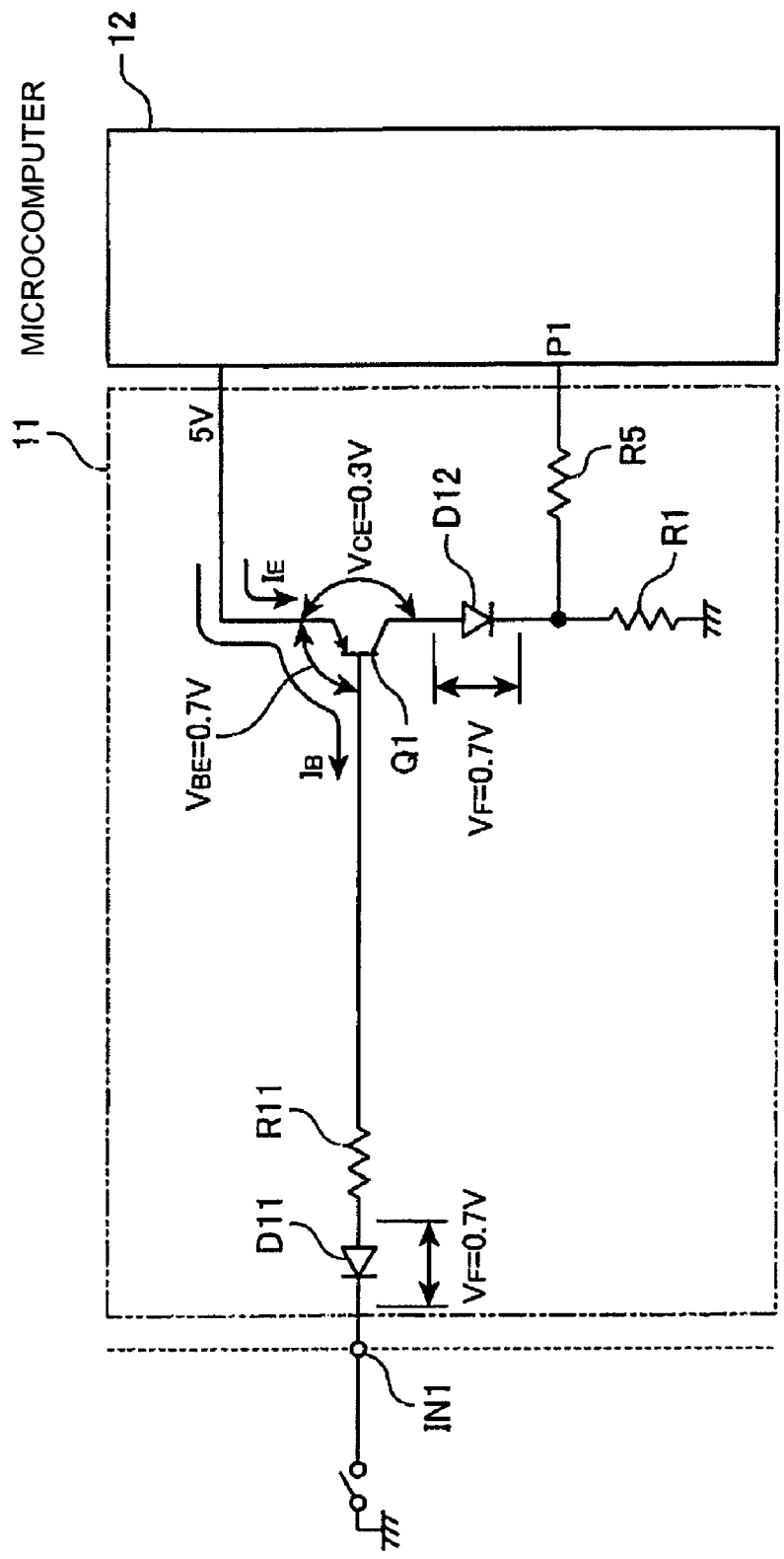
FIG. 3 is an electrical circuit diagram showing a part of the input circuit shown in FIG. 1 corresponding to one channel.

FIG. 3 is an electrical circuit diagram showing only one channel (part relating to the contact input terminal IN1) of the input circuit 1. As shown in FIG. 3, if it is assumed that the voltage $V_{BE}$ between the base and emitter of the transistor Q1 is e.g. 0.7 (V), a voltage $V_{CE}$ between the collector and emitter of the transistor Q1 is e.g. 0.3 (V), the forward voltages of the diodes D11, D12 are e.g. 0.7 (V), and the resistance values of the resistors R11, R1 are e.g. 47 (kΩ), an emitter current $I_E$ and a base current $I_B$ of the transistor Q1 are expressed by the following equations.

$$I_E = \{5-(0.3+0.7)\}/47 \times 10^3 \approx 0.09 \text{ (mA)}$$

$$I_B = \{5-(0.7+0.7)\}/47 \times 10^3 \approx 0.08 \text{ (mA)}$$

Accordingly, in the case of supplying the emitter currents of the transistors Q1 to Q8 as in the input circuit 11, the I/O ports P01, P02 of the microcomputer 12 need a current driving ability of e.g. 0.17 (mA) per channel. Thus, a current driving ability of e.g. 0.68 (mA) is required for four channels, and that of e.g. 1.36 (mA) is required for eight channels. If the current driving ability of the I/O ports P01, P02 exceeds that of the microcomputer 12, it results in an operation failure. Even in such a case, the operation failure can be suppressed by supplying the voltage from the power supply of the high level Vcc via the transistors Q01, Q02 without directly driving the transistors Q1 to Q8 by means of the microcomputer 22.

The input circuits 11, 21 of the preferred embodiment are used in judging the contact inputs at the contact input terminals IN1 to IN8 with which a large power load such as a lamp, a wiper motor or a heating coil is connected directly as described above, and suitably applied to an automotive electronic control unit.

The numbers of the output ports and the input ports of the microcomputer 12 are not restricted to two P01, P02 and four P1 to P4. For example, fifty ports or more may be provided in total. The numbers of common channels of the output ports and the input portions are not limited to four and two channels, and may be three and five or other numbers. Alternatively, some contact inputs may be directly connected with the input ports. It goes without saying that the number of ports, the number of common channels and the connection modes may be arbitrarily selected. Further, the present invention is not limited to the application to microcomputers, and can be suitably applied to semiconductor devices having a multitude of input ports such as an ASIC and a DSP.

What is claimed is:

1. An input circuit for commonly using input ports of a microcomputer for contact inputs of a plurality of channels by selection outputs from output ports of the microcomputer, comprising:
    first transistors provided for the respective contact inputs, and having bases connected with the contact inputs and emitters to which the selection output is given, and
    resistors having one terminal connected with collectors of the first transistors of the commonly used channels and the other terminal grounded,
    wherein a voltage at the one terminal of each resistor is fed to the corresponding input port of the microcomputer.

2. The input circuit of claim 1, further comprising second transistors having bases connected with the output ports of the microcomputer, emitters connected with a power supply, and collectors connected with the collectors of the first transistors.

3. The input circuit of claim 1, wherein cathodes of diodes are connected with the corresponding contact input terminals while anodes thereof are connected with bases of the corresponding first transistors via second resistors.

4. The input circuit of claim 3, wherein a resistor is provided between the base and the emitter of each first transistor.

5. The input circuit of claim 4, wherein a resistance value $R_{BE}$ of the resistors provided between the base and the emitter of each first transistor and a resistance value R of the second resistors are set such that $$(VDD-V1)R_{BE}/(R_{BE}+R) \geq V_{BE}$$

assuming that V1, VDD and $V_{BE}$ denote a rise of the potential at the contact input terminals, a high-level output voltage of I/O ports of the microcomputer, and an on-voltage of the first transistors.

6. An electronic control unit characterized by comprising the input circuit of claim 1 at an input side of a microcomputer.

* * * * *